US009315673B2

(12) United States Patent
Matsumoto et al.

(10) Patent No.: US 9,315,673 B2
(45) Date of Patent: Apr. 19, 2016

(54) INSULATED ULTRAFINE POWDER, METHOD FOR PRODUCING SAME, AND HIGH DIELECTRIC CONSTANT RESIN COMPOSITE MATERIAL

(75) Inventors: Takahiro Matsumoto, Chiba (JP); Hirotaka Tsuruya, Chiba (JP); Hajime Ban, Tokyo (JP); Reiki Akita, Tokyo (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 239 days.

(21) Appl. No.: 13/386,201

(22) PCT Filed: Jul. 9, 2010

(86) PCT No.: PCT/JP2010/061708
§ 371 (c)(1),
(2), (4) Date: Feb. 24, 2012

(87) PCT Pub. No.: WO2011/013501
PCT Pub. Date: Feb. 3, 2011

(65) Prior Publication Data
US 2012/0142836 A1    Jun. 7, 2012

(30) Foreign Application Priority Data

Jul. 28, 2009  (JP) .................................. 2009-175196
Feb. 12, 2010  (JP) ................................. 2010-029291

(51) Int. Cl.
*C08K 5/56* (2006.01)
*H01B 1/04* (2006.01)
(Continued)

(52) U.S. Cl.
CPC . *C09C 1/56* (2013.01); *B82Y 30/00* (2013.01); *C01B 31/02* (2013.01); *C08K 7/04* (2013.01);
(Continued)

(58) Field of Classification Search
None
See application file for complete search history.

(56) References Cited

U.S. PATENT DOCUMENTS

2002/0046872 A1    4/2002   Smalley et al.
2002/0168510 A1   11/2002   Satsu et al.
(Continued)

FOREIGN PATENT DOCUMENTS

EP    1 447 817 A2    8/2004
EP    1 788 040       5/2007
(Continued)

OTHER PUBLICATIONS

Matsumoto et al., "Development of high dielectric constant resin composite", The Chemical Society of Japan Koen Yokoshu, Mar. 13, 2006, pp. 728, vol. 86th, No. 1.
(Continued)

*Primary Examiner* — Ling Choi
*Assistant Examiner* — Catherine S Branch
(74) *Attorney, Agent, or Firm* — Greenblum & Bernstein, P.L.C.

(57) ABSTRACT

Provided are an insulated ultrafine powder obtained by adding liquid metal alkoxide to a methanol-containing organic solvent in which a conductive ultrafine powder comprising a carbon material is dispersed and further adding water thereto and a method for producing the same. Also, provided are an insulated ultrafine powder obtained by adding liquid metal alkoxide to a methanol-containing organic solvent in which a conductive ultrafine powder comprising a carbon material is dispersed, further adding a coupling agent having an alkoxide group and then adding water thereto and a method for producing the same. Further, provided is a high dielectric constant resin composite material obtained by blending the insulated ultrafine powder of the present invention with a resin in a volume ratio (insulated ultrafine powder/resin) falling in a range of 5/95 to 50/50.

6 Claims, 1 Drawing Sheet

(51) Int. Cl.

| | |
|---|---|
| *B82Y 30/00* | (2011.01) |
| *C09C 1/56* | (2006.01) |
| *C01B 31/02* | (2006.01) |
| *C08K 7/04* | (2006.01) |
| *C08K 9/04* | (2006.01) |
| *H01B 3/00* | (2006.01) |
| *H05K 1/03* | (2006.01) |

(52) U.S. Cl.
CPC ........ *C08K 9/04* (2013.01); *H01B 3/004* (2013.01); *H05K 1/0373* (2013.01); *C01P 2004/03* (2013.01); *C01P 2004/16* (2013.01); *C01P 2004/32* (2013.01); *C01P 2004/64* (2013.01); *C01P 2006/40* (2013.01); *H05K 2201/0239* (2013.01); *H05K 2201/0323* (2013.01); *Y10T 428/2982* (2015.01)

(56) References Cited

U.S. PATENT DOCUMENTS

| | | |
|---|---|---|
| 2005/0227077 A1 | 10/2005 | Sugiyama |
| 2005/0263744 A1 | 12/2005 | Kudoh et al. |
| 2006/0154071 A1* | 7/2006 | Homma .......... C01B 31/02 428/403 |
| 2011/0102231 A1 | 5/2011 | Matsumoto et al. |

FOREIGN PATENT DOCUMENTS

| | | |
|---|---|---|
| JP | 54-115800 | 9/1979 |
| JP | 2001/237507 | 8/2001 |
| JP | 2002/334612 | 11/2002 |
| JP | 2004/506530 | 3/2004 |
| JP | 2004-168846 | 6/2004 |
| JP | 2006-057005 | 3/2006 |
| JP | 2008-94962 | 4/2008 |
| WO | 2004/100180 | 11/2004 |
| WO | 2006/013947 | 2/2006 |

OTHER PUBLICATIONS

Search report from International Patent Application No. PCT/JP2010/061708, mail date is Sep. 21, 2010.

Extended European Search Report issued with respect to counterpart European Application No. 10804247.4-1301 / 2460765, dated Mar. 15, 2013.

Linsinger T et al., "JRC Reference Reports, Requirements on measurements for the implementation of the European Commision definition of the term nanomaterial", XP55113112, ISBN: 978927925602, URL:http://publications.jrc.ec.europa.eu/repository/bitstream/111111111/26399/2/irmm_nanomaterials(online). pdf, Jul. 1, 2012, pp. 1-52.

E.P.O. office action in EP10 804 247.4-1301, mail date is Apr. 14, 2014.

* cited by examiner

INSULATED ULTRAFINE POWDER, METHOD FOR PRODUCING SAME, AND HIGH DIELECTRIC CONSTANT RESIN COMPOSITE MATERIAL

TECHNICAL FIELD

The present invention relates to an insulated ultrafine powder, a method for producing the same and a high dielectric constant resin composite material prepared by using the above insulated ultrafine powder.

BACKGROUND ART

One of causes of data errors in IC (integrated circuit) includes an influence of high frequency noise. Known is a method for inhibiting the above matter in which a capacitor having a large capacity is provided on a wiring board to remove high frequency noise. A capacitor having such a large capacity is produced by forming a high dielectric constant layer on a wiring board. Further, a size of a built-in antenna and a thickness of a wave absorber are almost inversely proportional to a square root of a dielectric constant, and therefore a high dielectric constant material is useful for a reduction in a size and a reduction in a thickness of the above members. In particular, resin materials which are excellent in a processability and a moldability are required to be endowed with the above characteristic.

A resin composite material in which 65 vol % or more, that is, 80 wt % or more of a strong dielectric substance represented by barium titanate is filled as a high dielectric constant filler is proposed as a conventional technique of a high dielectric constant resin composite material (refer to, for example, a patent document 1). On the other hand, a high dielectric constant composition for coating a conductive powder with an insulated film by a thermosetting resin is proposed (refer to, for example, a patent document 2). However, the stable performance is not obtained, and therefore it is not commercially produced. Further, a method for coating a metal powder with metal oxide (refer to, for example, a patent document 3) is proposed in recent years. However, it has to be filled at a high level as is the case with conventional high dielectric constant fillers, and in addition thereto, a metal powder has usually a higher specific gravity than that of metal oxide, so that a specific gravity of a high dielectric constant resin composite material is as further large as 3 or more.

Further, proposed as well is a method in which a material prepared by winding a high polymer around a single layer carbon nanotube to insulate it is used for a rise in a dielectric constant of a resin material (refer to, for example, a patent document 4). In the above method, however, the wound high polymer which corresponds to an insulated coating film can reversibly be peeled off, and therefore the problem that the stable performance is not obtained has been involved therein.

Consequently, the existing situation is that in fact, a method in which a large amount of the filler described above is added is used. Accordingly, a processability, a moldability and a light weight which are the intrinsic characteristics of a resin material are damaged in exchange for a rise in a dielectric constant thereof.

In order to solve the above problems, the present inventors have disclosed previously an insulated ultrafine powder prepared by coating a specific conductive ultrafine powder with specific metal oxide and a high dielectric constant resin composite material prepared by using the above insulated ultrafine powder (refer to, for example, patent documents 5 and 6).

RELATED ART DOCUMENTS

Patent Documents

Patent document 1: Japanese Patent Application Laid-Open No.
Patent document 2: Japanese Patent Application Laid-Open No. 115800/1979
Patent document 3: Japanese Patent Application Laid-Open No. 334612/2002
Patent document 4: Japanese Patent Application Laid-Open (through PCT) No. 506530/2004
Patent document 5: International Patent Publication Pamphlet WO2006/013947
Patent document 6: Japanese Patent Application Laid-Open No. 94962/2008

SUMMARY OF THE INVENTION

Problems to be Solved by the Invention

Metal oxide for forming an insulated coating film of the insulated ultrafine powder described above is obtained by depositing metal hydroxide from metal alkoxide by sol-gel reaction in an organic solvent in which a conductive ultrafine powder is dispersed, then subjecting it to dehydrating condensation and further subjecting it to surface treatment to provide it with a hydrophobicity.

In the insulated ultrafine powder thus obtained, the coating film obtained by a sol-gel method is porous, and therefore there has been involved therein the problem that while particularly a high dielectric constant resin composite material in which an insulated ultrafine powder is filled to a high extent is increased in a dielectric constant, tan δ showing a loss of an electric energy is liable to be increased.

As can be found from the above, an object of the present invention is to provide an insulated ultrafine powder which can reduce tan δ while maintaining a dielectric constant of a high dielectric constant resin composite material in a high state, a method for producing the same and a high dielectric constant resin composite material prepared by using the above insulated ultrafine powder.

Means for Solving the Problems

Intense investigations repeated by the present inventors in order to solve the problems described above have resulted in finding out an insulated ultrafine powder which provides a resin composite material with a high dielectric constant while inhibiting an increase in tan δ by a simple method, a method for producing the same and a high dielectric constant resin composite material prepared by using the above insulated ultrafine powder. That is, the present invention shall be shown below.

[1] An insulated ultrafine powder obtained by adding liquid metal alkoxide to a methanol-containing organic solvent in which a conductive ultrafine powder comprising a carbon material is disperse and further adding water thereto.
[2] An insulated ultrafine powder obtained by adding liquid metal alkoxide to a methanol-containing organic solvent in which a conductive ultrafine powder comprising a carbon material is dispersed, further adding an organic silicon compound or a coupling agent and then adding water thereto.

[3] The insulated ultrafine powder according to the above item [1] or [2], wherein a cross-sectional diameter of the conductive ultrafine powder comprising a carbon material is 1 nm or more and 500 nm or less.

[4] The insulated ultrafine powder according to the above item [1] or [2], wherein the carbon material constituting the conductive ultrafine powder is a carbon nanofiber, natural graphite, carbon black, a carbon nanotube or artificial graphite.

[5] The insulated ultrafine powder according to the above item [1] or [2], wherein a constitutional metal element of the liquid metal alkoxide contains at least any one kind of Ti and Zr.

[6] The insulated ultrafine powder according to the above item [2], wherein the coupling agent is a silane base coupling agent.

[7] A high dielectric constant resin composite material obtained by blending the insulated ultrafine powder according to the above item [1] or [2] with a resin in a volume ratio (insulated ultrafine powder/resin) falling in a range of 5/95 to 50/50.

[8] The high dielectric constant resin composite material according to the above item [7], wherein the resin is a thermoplastic resin.

[9] The high dielectric constant resin composite material according to the above item [7], wherein the resin is any of polypropylene, polystyrene, modified polyphenylene ether, polybutylene terephthalate and polyphenylene sulfide.

[10] The high dielectric constant resin composite material according to the above item [7], wherein a specific gravity thereof is 2 or less.

[11] The high dielectric constant resin composite material according to the above item [7], further containing a filler.

[12] The high dielectric constant resin composite material according to the above item [7], wherein a specific inductive capacity thereof is 10 or more.

[13] A method for producing an insulated ultrafine powder, wherein liquid metal alkoxide is added to a methanol-containing organic solvent in which a conductive ultrafine powder comprising a carbon material is dispersed, and water is further added thereto.

[14] A method for producing an insulated ultrafine powder, wherein liquid metal alkoxide is added to a methanol-containing organic solvent in which a conductive ultrafine powder comprising a carbon material is dispersed; a coupling agent having an alkoxide group is further added; and then water is added thereto.

According to the present invention, capable of being provided an insulated ultrafine powder which can reduce tan δ while maintaining a dielectric constant of a high dielectric constant resin composite material in a high state, a method for producing the same and a high dielectric constant resin composite material prepared by using the above insulated ultrafine powder.

EMBODIMENTS FOR CARRYING OUT THE INVENTION

1. Insulated Ultrafine Powder and Method for Producing the Same:

The first insulated ultrafine powder of the present invention is obtained by adding liquid metal alkoxide to a methanol-containing organic solvent in which a conductive ultrafine powder comprising a carbon material is dispersed and further adding water thereto.

Further, the second insulated ultrafine powder of the present invention is obtained by adding liquid metal alkoxide to a methanol-containing organic solvent in which a conductive ultrafine powder comprising a carbon material is dispersed, further adding an organic silicon compound or a coupling agent and then adding water thereto.

The first insulated ultrafine powder and the second insulated ultrafine powder according to the present invention (hereinafter, they shall be collectively referred to as "the insulated ultrafine powder of the present invention") shall be explained below in detail.

A powder which reduces a volume resistance of a resin composite material when added alone to the resin material, that is, which has an effect of providing an electric conductivity is used as the insulated ultrafine powder according to the present invention. To be specific, used is a conductive carbon material such as natural graphite, artificial graphite, furnace carbon black, graphitized carbon black, carbon nanotube, carbon nanofiber and the like.

In contrast with the conductive carbon material, an ultrafine powder of metal which is a representative conductive substance is not only susceptible to oxidation excluding a part of noble metals and liable to be reduced in conductivity but also is likely to be subjected to dust explosion. Also, a metal atom is diffused from the ultrafine powder into an insulating medium to reduce an insulating property of a resin composite material. In contrast with this, the conductive carbon material does not bring about the above problems. Further, the carbon material has a small specific gravity of 2.2 and has characteristics which are not imparted to other conductive substances and conventional high dielectric constant fillers, and it has as well an effect of a reduction in a weight of a high dielectric constant composite material.

The conductive ultrafine powder used in the present invention includes spherical carbon materials having a particle diameter of preferably 1 nm or more and 500 nm or less, more preferably 5 nm or more and 300 nm or less and further preferably 10 nm or more and 100 nm or less. Such spherical carbon materials, for example, carbon blacks are obtained by thermally cracking hydrocarbon raw materials in a gas phase. Further, graphitized carbon blacks are obtained by vaporizing carbon materials by arc discharge in an atmosphere system of He, CO or a mixed gas thereof in a depressurized vessel maintained at an inner pressure of 2 to 19 Torr and cooling and solidifying the vaporized carbon gas.

To be specific, they include SEAST S, TOKABLACK #7100F, conductive carbon blacks #5500, #4500, #4400 and #4300, graphitized carbon blacks #3855, #3845 and #3800 each manufactured by Tokai Carbon Co., Ltd., #3050B, #3030B, #3230B, #3350B, MA7, MA8 and MA11 each manufactured by Mitsubishi Chemical Corporation and Ketjen Black EC and Ketjen Black EC600JD each manufactured by Lion Corporation.

In this regard, the term "spherical" does not have to be strictly spherical and may be an isotropic form. It may be, for example, a polyhedron having edges. Also, when it is not spherical, the "particle diameter" means the smallest diameter.

Also, the conductive ultrafine powder used in the present invention includes fibrous carbon materials having a cross-sectional diameter of preferably 1 nm or more and 500 nm or less, more preferably 5 nm or more and 300 nm or less and further preferably 10 nm or more and 200 nm or less. A length thereof is preferably 3 times or more and 300 times or less of the sectional diameter.

The above fibrous carbon materials, for example, carbon nanofibers and carbon nanotubes are obtained by mixing organic metal compounds of cobalt and iron which are catalysts with hydrocarbon raw materials in a gas phase and heating them. Further, the carbon nanofibers are obtained by melting and spinning phenol base resins and heating them under inactive atmosphere.

To be specific, they include VGCF and VGNF each manufactured by Showa Denko K.K., Carbel manufactured by GSI Creos Corporation and carbon nanofibers manufactured by Gun Ei Chemical Industry Co., Ltd.

In this regard, the term "fibrous" means a form extending toward a single direction and may be, for example, square timber-like, round bar-like and subspherical. When it is square timber-like, the "cross-sectional diameter" means the smallest diameter.

Further, the conductive ultrafine powder used in the present invention includes tabular carbon materials having a thickness of preferably 1 nm or more and 500 nm or less, more preferably 5 nm or more and 300 nm or less and further preferably 10 nm or more and 200 nm or less. A length and a width thereof are preferably 3 times or more and 300 times or less of the sectional diameter.

The above tabular carbon materials are obtained by, for example, refining, crushing and classifying natural graphite and artificial graphite. They include, for example, SGP series, SNO series and the like each manufactured by SEC CARBON LTD. and scale-like-graphite powders, flaked graphite powders and the like each manufactured by Nippon Graphite Industries, Ltd. They may be further crushed and precisely classified.

In this regard, the term "tabular" means a form in which one direction shrinks and may be, for example, flat sphere-like and flaky.

Controlling a diameter, a cross-sectional diameter or a thickness of the above particles to the ranges described above makes it possible to prevent the conductivity from being reduced by a quantum size effect. Further, production thereof is facilitated to make it possible to industrially use them, and a handling property thereof can be made more difficult to be reduced by aggregation. Further, a continuous layer can sufficiently be formed in a range of 50 vol % or more, that is, a range of an addition rate at which the resin characteristics are not deteriorated.

Further, when a form of the conductive ultrafine powder is fibrous or tabular, an aspect ratio thereof is preferably 3 to 300. The conductive ultrafine powder used in the present invention is more preferably fibrous than spherical and tabular. This is because an addition amount of the fibrous ultrafine powder which is required for forming a continuous layer of the resin composite material having a specific inductive capacity of 20 or more can be reduced to, for example, 30 vol % or less.

The particle diameter, the cross-sectional diameter, the thickness and the aspect ratio can be determined by means of a scanning electron microscope.

In the present invention, an insulated coating film is formed on a surface of the conductive ultrafine powder by adding liquid metal alkoxide to the methanol-containing organic solvent in which the conductive ultrafine powder comprising a carbon material is disperse and further adding water thereto.

The liquid metal alkoxide used for forming the insulated coating film is metal alkoxide which stays in a liquid state at a temperature of lower than a boiling point of methanol, that is, lower than 64.7° C. at an atmospheric pressure. It includes, for example, tetraethoxytitanium having a melting point of 54° C.

Particularly preferred are alkoxytitanium such as tetraisopropoxytitanium, tetra-normal-butoxytitanium, a tetra-normal-butoxytitanium dimer, tetra-2-ethylhexoxytitanium, triethoxymonopropoxytitanium and the like; and alkoxyzirconium such as tetra-secondary-butoxyzirconium, tetra-tertiary-butoxyzirconium and the like, which are liquid at room temperature.

A content of methanol in the methanol-containing organic solvent is preferably 5% by weight or more, more preferably 12% by weight or more, further preferably 20% by weight or more and particularly preferably 100% by weight. The organic solvent used together with methanol include ethanol, 2-propanol, acetone, 2-butanone, tetrahydrofuran, dimethylformamide, dimethylacetamide, N-methyl-2-pyrrolidone, hexane, toluene, xylene and the like.

A use amount of the methanol-containing organic solvent is regulated by an amount of methanol in the above methanol-containing organic solvent and an amount of the liquid metal alkoxide added. To be specific, an amount of methanol used is preferably an amount in which a methoxy group is formed by alcohol substitution reaction of the liquid metal alkoxide and in which solid metal methoxide is formed, and it is controlled preferably to a content of 4 times (mole ratio) or more of the liquid metal alkoxide.

Further, methanol may be added after adding the liquid metal alkoxide to an organic solvent (for example, an organic solvent other than methanol described above) in which the conductive ultrafine powder comprising a carbon material is disperse to result in preparing the methanol-containing organic solvent. Methanol may be added to the organic solvent together with or alternately with the liquid metal alkoxide.

In the present invention, methanol as the organic solvent is an essential component, and this is a very important component since a precursor (for example, tetramethoxytitanium) of an insulated coating film is formed on a surface of the conductive ultrafine powder by making use of that the liquid metal alkoxide is turned into a solid material by alcohol substitution reaction. Further, hydrolysis reaction and dehydrating polycondensation reaction proceed by adding water, and a minute $TiO_2$ insulated coating film is formed on a surface of the conductive ultrafine powder.

A hydroxyl group remains on a surface of the ultrafine powder on which the insulated coating film is formed by the method described above. The above surface hydroxyl group cross-links the insulated ultrafine powders by a coating film of insulated metal alkoxide by hydrating condensation followed by filtering and drying. That is, it solidifies the insulated ultrafine powder in a certain case. Accordingly, in a case of compounding with the resin material in which a strong stress is exerted on the insulated ultrafine powder, breakage of the insulated coating film is liable to be brought about in melting and kneading with a thermoplastic resin on a mass production condition using, for example, a double shaft extruding equipment, and the dielectric characteristic is destabilized. In order to prevent the above matter, the insulated ultrafine powder is subjected preferably, as is the case with the second insulated ultrafine powder of the present invention, to surface treatment by an organic silicon compound or a coupling agent (particularly a coupling agent having an alkoxide group) to be turned into hydrophobicity.

In order to obtain the second insulated ultrafine powder of the present invention, first the liquid metal alkoxide is added, as is the case with the first insulated ultrafine powder, to the methanol-containing organic solvent in which the conductive ultrafine powder comprising a carbon material is dispersed. Thereafter, an organic silicon compound or a coupling agent (particularly a coupling agent having an alkoxide group) is further added thereto, and then water is added to thereby obtain the second insulated ultrafine powder.

In the reaction for obtaining the second insulated ultrafine powder of the present invention, the reaction of the liquid metal alkoxide with the organic silicon compound or the coupling agent and water can be allowed to proceed at an ordinary temperature and an ordinary pressure in the methanol-containing organic solvent in which the conductive ultrafine powder is dispersed. That is, the steps of adding acid and alkali catalysts for promoting reaction after forming a $TiO_2$ coating film as ever, dehydrating and distilling become unnecessary, and therefore the insulated ultrafine powder having a high productivity can be prepared.

The organic silicon compound used for surface treatment in the present invention is at least one compound selected from the group consisting of alkoxysilanes, organosilane compounds produced from alkoxysilanes, polysiloxanes, modified polysiloxanes, end-modified polysiloxanes and fluoroalkylsilanes. Among them, alkoxysilanes, fluoroalkylsilanes and polysiloxanes are preferred.

The alkoxysilanes include, to be specific, methyltriethoxysilane, dimethyldiethoxysilane, phenyltriethoxysilane, diphenyldiethoxysilane, dimethyldimethoxysilane, methyltrimethoxysilane, phenyltrimethoxysilane, diphenyldimethoxysilane, isobutyltrimethoxysilane, decyltrimethoxysilane, vinyltrimethoxysilane, vinyltriethoxysilane, γ-aminopropyltriethoxysilane, γ-glycidoxypropyltrimethoxysilane, γ-mercaptopropyltrimethoxysilane, γ-methacryloxypropyltrimethoxysilane, N-β(aminoethyl)-γ-aminopropyltrimethoxysilane, γ-glycidoxypropylmethyldimethoxysilane and the like.

Considering an adhesion strength to insulating metal oxide or metal oxide coating film particles formed on the conductive ultrafine powder, more preferred are alkoxysilanes such as methyltriethoxysilane, methyltrimethoxysilane, dimethyldimethoxysilane, isobutyltrimethoxysilane, phenyltriethoxysilane and the like or organosilane compounds produced from the above alkoxysilanes.

Also, polysiloxanes having a methylhydrogensiloxane unit, polyether-modified polysiloxanes and end carboxylic acid-modified polysiloxanes in which an end is modified by carboxylic acid can be listed as the polysiloxanes.

The fluoroalkylsilanes include, to be specific, trifluoropropyltrimethoxysilane, tridecafluorooctyltrimethoxysilane, heptadecafluorodecyltrimethoxysilane, heptadecafluorodecylmethyldimethoxysilane, trifluoropropylethoxysilane, tridecafluorooctyltriethoxysilane, heptadecafluorodecyltriethoxysilane and the like.

Also, at least one compound selected from the group consisting of silane base, titanate bas, aluminate base and zirconate base silane coupling agents can be used as the coupling agent used for surface treatment.

Among the coupling agents described above, the silane base coupling agents include a part of the organic silane compounds listed above, that is, alkoxysilanes, and silane base coupling agents other than alkoxysilanes include methyltrichlorosilane, phenyltrichlorosilane, dimethyldichlorosilane, methyltrichlorosilane, phenyltrichlorosilane, diphenyldichlorosilane, isobutyltrichlorosilane, decyltrichlorosilane, vinyltrichlorosilane, γ-aminopropyltrichlorosilane, γ-glycidoxypropyltrichlorosilane, γ-mercaptopropyltrichlorosilane, γ-methacryloxypropyltrichlorosilane, N-β(aminoethyl)-γ-aminopropyltrichlorosilane and the like.

The titanate base coupling agents include isopropyltristearoyl titanate, isopropyltris(dioctylpyrophosphate) titanate, isopropyltri(N-aminoethyl-aminoethyl) titanate, tetraoctylbis(ditridecylphosphate) titanate, tetra(2-2-diallyloxymethyl-1-butyl)bis(ditridecyl)phosphate titanate, bis(dioctylpyrophosphate)oxyacetate titanate, bis(dioctylpyrophosphate)ethylene titanate and the like.

The aluminate base coupling agents include acetoalkoxyaluminum diisopropylate, aluminum diisopropoxymonoethylacetoacetate, aluminum trisethylacetoacetate, aluminum trisacetylacetoacetate and the like.

The zirconate base coupling agents include zirconium tetrakisacetylacetonate, zirconium dibutoxybisacetylacetonate, zirconium tetrakisethylacetoacetate, zirconium tributoxymonoethylacetoacetate, zirconium tributoxyacetylacetonate and the like.

A use amount of the surface treating agent is varied according to a degree of the surface hydroxyl group amount, and it is preferably 0.01 to 30 parts by weight based on 100 parts by weight of the insulated ultrafine powder (that is, the first insulated ultrafine powder) before subjected to the treatment. If it falls in the above range, the insulated ultrafine powder can sufficiently be dispersed in the resin, and an adhesive property of the insulated ultrafine powder with the resin can be secured as well. It is more preferably 0.1 to 25 parts by weight, particularly preferably 1 to 15 parts by weight.

After the insulated ultrafine powder is filtered and dried passing through the surface treatment, it may be further subjected to calcining treatment. The calcining treatment is preferably carried out by maintaining the insulated ultrafine powder in a temperature range of 200 to 1000° C. for 30 minutes to 24 hours. However, when the conductive ultrafine powder is a carbon material, the calcining atmosphere has to be non-oxidative. That is, substitution with nitrogen and argon has to be carried out to cut off oxygen.

2. High Dielectric Constant Resin Composite Material:

The high dielectric constant resin composite material of the present invention is obtained by blending the insulated ultrafine powder of the present invention with the resin in a volume ratio (insulated ultrafine powder/resin) of 5/95 to 50/50, that is, the insulated ultrafine powder of the present invention in a range of 5 to 50 vol %.

The high dielectric constant resin composite material having a specific inductive capacity of 20 or more is obtained by blending the insulated ultrafine powder of the present invention in an amount of 50 vol % or less. When a conventional high dielectric constant filler is used, about 50 vol % or more of the above filler has to be blended in order to obtain the high dielectric constant resin composite material having a specific inductive capacity of 20 or more, but when the insulated ultrafine powder of the present invention is used, 5 to 50 vol % of the above insulated ultrafine powder is suitably blended. Accordingly, the resin composite material prepared by blending the insulated ultrafine powder of the present invention exerts a high dielectric constant without damaging a molding processability and a light weight property which are the intrinsic characteristics of the resin material.

In the present invention, the resin component to which the insulated ultrafine powder described above is added may be either of a thermoplastic resin and a thermosetting resin, and a thermoplastic resin is preferred.

The thermoplastic resin includes general purpose plastics such as polyethylene, polyvinyl chloride, polypropylene, polystyrene, polyvinyl acetate, ABS resins, AS resins, acryl resins and the like, engineering plastics such as polyacetal, polyamide, polycarbonate, modified polyphenylene ether, polybutylene terephthalate and the like and super engineering plastics such as polyallylate, polysulfone, polyphenylene sulfide, polyethersulfone, polyetheretherketone, polyimide resins, fluororesins, polyamideimide and the like. Among them, it is preferably any of polypropylene, polystyrene, modified polyphenylene ether, polybutylene terephthalate and polyphenylene sulfide.

The thermosetting resin includes phenol resins, amino resins (urea resins, melamine resins, benzoguanamine resins), unsaturated polyester resins, diallyl phthalate resins (allyl resins), alkyd resins, epoxy resins, urethane resins (polyurethane), silicone resins (silicone) and the like.

The high dielectric constant resin composite material of the present invention can be used by further adding, if necessary, a filler for a purpose other than a high dielectric constant. The filler includes glass fibers for improving the elastic modulus, calcium carbonate for reducing the molding shrinkage rate, talc used for improving the surface flatness and the abrasion resistance and mica used for improving the dimension stability. Further, a filler for providing the flame retardancy, that is, a flame retardant includes halogen base or phosphorus base flame retardants, aluminum hydroxide and magnesium hydroxide.

When the high dielectric constant resin composite material is used as a wave absorber, capable of being further added are ferrite powders used for controlling a radio wave absorption characteristic by conventional techniques, magnetic metal powders comprising iron as a principal component, conductive powders of a carbon base and a tin oxide base and exfoliated graphite powders which are conductive powders having as well an effect as a flame retardant.

In the present invention, an addition amount of the insulated ultrafine powder to the resin composition is, as already described, 5 to 50 vol %, preferably 5 to 30 vol %. If it is smaller than 5 vol %, the continuous layer is not formed in the resin composition, and the satisfactory specific inductive capacity is not obtained. On the other hand, if it is larger than 50 vol %, an intrinsic processability of the resin composition is damaged.

In the high dielectric constant resin composite material of the present invention, the carbon material is used for a raw material of the insulated ultrafine powder, and therefore a specific gravity thereof can be reduced to 2 or less.

When the high dielectric constant resin composite material of the present invention is used for an antenna substrate, the above high dielectric constant resin composite material has preferably a specific inductive capacity of 20 or more. Wiring patterns are provided at least on one surface of a layer having a thickness of 1 μm or more and 3 mm or less which is formed from the above high dielectric constant resin composite material, to be more specific, a film molded therefrom in a thickness of 1 μm to 100 μm or a sheet molded therefrom in a thickness of 100 μm to 3 mm, whereby the antenna substrate can be formed.

Further, a through-hole can be provided as well, if necessary, on the film or the sheet of the high dielectric constant resin composite material.

When the high dielectric constant resin composite material of the present invention is used for a non-contact IC card/tag, IC may be wired directly on the wiring patterns of an antenna substrate, or a card/tag having built-in IC may be brought into contact with the antenna substrate to use it as a booster antenna. Further, when a film or a sheet of the high dielectric constant resin composite material of the present invention is used as an antenna substrate and a non-contact IC card, a protective film may be stuck thereof if necessary.

A wave absorber having a specific inductive capacity of 20 or more is obtained by blending the insulated ultrafine powder of the present invention with the resin in an amount of 5 vol % or more and 50 vol % or less. When a conventional high dielectric constant filler is used, about 50 vol % or more of the above filler has to be blended in order to obtain the high dielectric constant resin composite material having a specific inductive capacity of 20 or more, but when the insulated ultrafine powder of the present invention is used, 50 vol % or less, for example, 5 to 50 vol % of the above insulated ultrafine powder is suitably blended. Accordingly, the resin composite material prepared by blending the insulated ultrafine powder of the present invention exerts a high dielectric constant without damaging a molding processability and a light weight property which are the intrinsic characteristics of the resin material.

A wave absorber prepared by using the above high dielectric constant resin composite material of the present invention has a high dielectric constant, and therefore when it is turned into a sheet, a thickness thereof to a wavelength of an electric wave to be absorbed can be set to ⅟₂₀ or less. A wave absorber prepared by using the above high dielectric constant resin composite material of the present invention can be used in an inside of a case and shows an excellent performance as an electronic equipment. Further, the carbon material is used for the raw material of the insulated ultrafine powder, and therefore a specific gravity of the wave absorber can be reduced to 2 or less to make it possible to reduce further a weight thereof.

EXAMPLE

Next, the present invention shall be explained in further details with reference to examples and comparative examples, but the present invention shall by no means be restricted by these examples.

The resin composite material was molded into a disk of 30 mmσ and a thickness of 3 mm, and a specific inductive capacity thereof was measured at room temperature and 1 MHz by means of an impedance analyzer (4294A manufactured by Agilent Technologies, Inc.).

Figure 1:
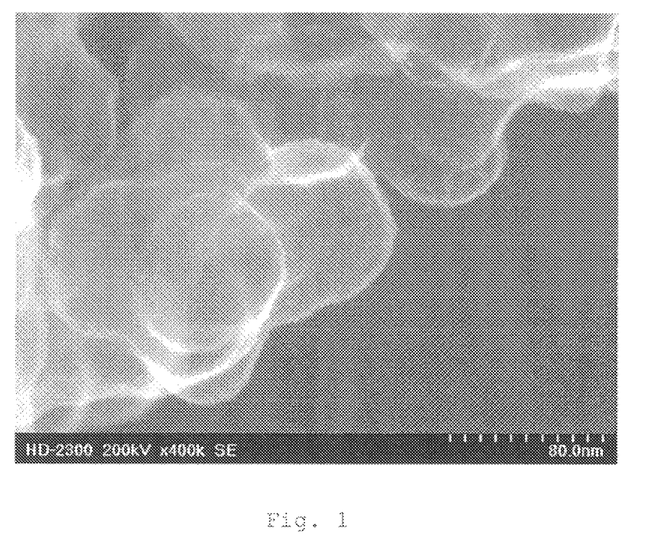
FIG. 1 is a scanning electron micrograph of an insulated ultrafine powder obtained by the synthetic method 1 for an insulated ultrafine powder.

Synthesizing Method 1 for Insulated Ultrafine Powder:

A 2 L glass-made reaction vessel was used, and 100 parts by weight of carbon black (spherical particles having a diameter of 50 to 100 nm and an average particle diameter of 40 nm) and 100 parts by weight of tetraisopropoxytitanium were added to 800 parts by weight of methanol and stirred and mixed at 30° C. for 1 hour. Next, 10 parts by weight of phenyltrimethoxysilane was added thereto and mixed for 30 minutes. Further, 30 parts by weight of distilled water was dropwise added thereto in 30 minutes and stirred for 2 hours to obtain a carbon black particles insulated by $TiO_2$/methanol dispersion liquid. Next, a wet cake obtained by subjecting the above dispersion liquid to solid-liquid separation by means of a vacuum filtering bottle was dried by means of a vacuum dryer to thereby obtain carbon black particles (insulated ultrafine powder) insulated by $TiO_2$. The above insulated ultrafine powder was observed at a magnification of 400,000 times under a scanning transmission electron microscope (HD-2300 manufactured by Hitachi Hi-Technologies Corporation) to confirm that a $TiO_2$ coating film was formed on a surface of the carbon black. It was found that a coating film state thereof was flat and that the coating film was minute (FIG. 1).

Synthesizing Method 2 for Insulated Ultrafine Powder:

Synthesis was carried out in the same manner to obtain carbon black particles (insulated ultrafine powder) insulated by $TiO_2$, except that in the synthesizing method 1, the solvent was changed to a methanol/2-butanone (100 parts by weight/70 parts by weight) mixed solvent.

Figure 2:
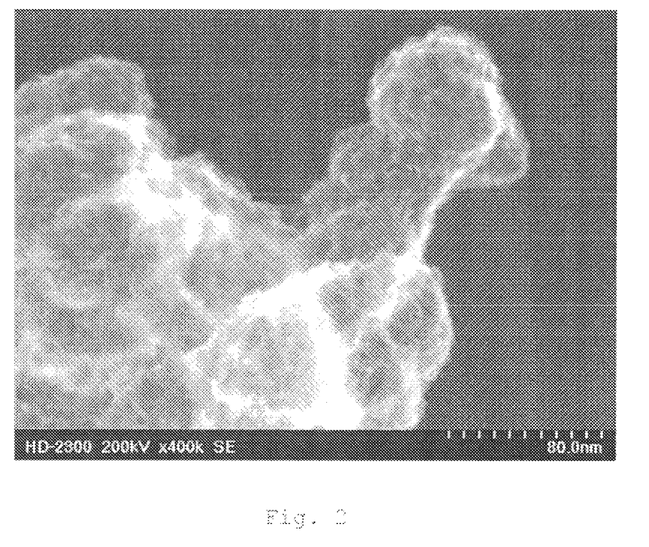
FIG. 2 is a scanning electron micrograph of an insulated ultrafine powder obtained by the synthetic method 3 for an insulated ultrafine powder.

Synthesizing Method 3 for Insulated Ultrafine Powder:

A 2 L glass-made reaction vessel was used, and 100 parts by weight of carbon black (spherical particles having a diameter of 50 to 100 nm and an average particle diameter of 40 nm) and 100 parts by weight of tetraisopropoxytitanium were added to 800 parts by weight of isopropanol and stirred and mixed at 30° C. for 1 hour. Next, 10 parts by weight of phenyltrimethoxysilane was added thereto and mixed for 30 minutes. Further, 30 parts by weight of distilled water was dropwise added thereto in 30 minutes and stirred for 2 hours to obtain a carbon black particles insulated by $TiO_2$/isopropanol dispersion liquid. Next, a wet cake obtained by subjecting the above dispersion liquid to solid-liquid separation by means of a vacuum filtering bottle was dried by means of a vacuum dryer to thereby obtain carbon black particles (insulated ultrafine powder) insulated by $TiO_2$. The above insulated ultrafine powder was observed at a magnification of 400,000 times under the scanning transmission electron microscope (HD-2300 manufactured by Hitachi Hi-Technologies Corporation) to confirm that a $TiO_2$ coating film was formed on a surface of the carbon black. It was found that a coating film state thereof was irregular in many portions and that voids were present (FIG. 2).

Synthesizing Method 4 for Insulated Ultrafine Powder:

Synthesis was carried out in the same manner to obtain carbon nanofiber particles (insulated ultrafine powder) insulated by $TiO_2$, except that in the synthesizing method 1, carbon nanofiber (fibrous form having a cross-sectional diameter of 150 nm and a length of 5 to 6 μm) was used in place of carbon black.

Synthesizing Method 5 for Insulated Ultrafine Powder:

Synthesis was carried out in the same manner to obtain natural graphite particles (insulated ultrafine powder) insulated by $TiO_2$, except that in the synthesizing method 1, natural graphite (tabular form having a thickness of 100 to 200 nm, an average thickness of 150 nm, a square of 1 to 3 μm and an average square of 2 μm) was used in place of carbon black.

Synthesizing Method 6 for Insulated Ultrafine Powder:

Synthesis was carried out in the same manner to obtain carbon black particles (insulated ultrafine powder) insulated by $ZrO_2$, except that in the synthesizing method 1, tetra-tertiary-butoxyzirconium was used in place of tetraisopropoxytitanium.

Example 1

The insulated ultrafine powder obtained in the synthesizing method 1 for insulated ultrafine powder and polyphenylene sulfide (PPS) were molten and kneaded at 300° C. by means of a melt kneading equipment so that a volume ratio of insulated ultrafine powder/PPS was 25/75, and the mixture was pelletized to obtain a resin composite material.

A dielectric constant thereof at 1 MHz was measured to find that a specific inductive capacity was 25 and that a dielectric loss tangent was 0.01. Further, a specific gravity of the resin composite material was 1.49.

Example 2

The components were molten and kneaded at 300° C. by means of a melt kneading equipment in the same manner as in Example 1, except that a volume ratio of insulated ultrafine powder/PPS was changed to 20/80, and the mixture was pelletized to obtain a resin composite material.

A dielectric constant thereof at 1 MHz was measured to find that a specific inductive capacity was 20 and that a dielectric loss tangent was 0.006. Further, a specific gravity of the resin composite material was 1.46.

Example 3

The components were molten and kneaded at 300° C. by means of a melt kneading equipment in the same manner as in Example 1, except that a volume ratio of insulated ultrafine powder/PPS was changed to 30/70, and the mixture was pelletized to obtain a resin composite material.

A dielectric constant thereof at 1 MHz was measured to find that a specific inductive capacity was 40 and that a dielectric loss tangent was 0.02. Further, a specific gravity of the resin composite material was 1.52.

Example 4

The components were molten and kneaded at 300° C. by means of a melt kneading equipment in the same manner as in Example 3, except that the particles synthesized in the synthesizing method 2 for insulated ultrafine powder were used, and the mixture was pelletized to obtain a resin composite material.

A dielectric constant thereof at 1 MHz was measured to find that a specific inductive capacity was 39 and that a dielectric loss tangent was 0.02. Further, a specific gravity of the resin composite material was 1.52.

Comparative Example 1

The components were molten and kneaded at 300° C. by means of a melt kneading equipment in the same manner as in Example 3, except that the particles synthesized in the synthesizing method 3 for insulated ultrafine powder were used, and the mixture was pelletized to obtain a resin composite material.

A dielectric constant thereof at 1 MHz was measured to find that a specific inductive capacity was 39 and that a dielectric loss tangent was 0.04. Further, a specific gravity of the resin composite material was 1.52.

Example 5

The components were molten and kneaded at 300° C. by means of a melt kneading equipment in the same manner as in Example 1, except that the particles synthesized in the synthesizing method 4 for insulated ultrafine powder were used, and the mixture was pelletized to obtain a resin composite material.

A dielectric constant thereof at 1 MHz was measured to find that a specific inductive capacity was 28 and that a dielectric loss tangent was 0.01. Further, a specific gravity of the resin composite material was 1.45.

Example 6

The components were molten and kneaded at 300° C. by means of a melt kneading equipment in the same manner as in Example 1, except that the particles synthesized in the synthesizing method 5 for insulated ultrafine powder were used, and the mixture was pelletized to obtain a resin composite material.

A dielectric constant thereof at 1 MHz was measured to find that a specific inductive capacity was 25 and that a dielectric loss tangent was 0.008. Further, a specific gravity of the resin composite material was 1.45.

Example 7

The components were molten and kneaded at 300° C. by means of a melt kneading equipment in the same manner as in Example 1, except that the particles synthesized in the synthesizing method 6 for insulated ultrafine powder were used, and the mixture was pelletized to obtain a resin composite material.

A dielectric constant thereof at 1 MHz was measured to find that a specific inductive capacity was 26 and that a dielectric loss tangent was 0.012. Further, a specific gravity of the resin composite material was 1.49.

Example 8

The insulated ultrafine powder obtained in the synthesizing method 1 for insulated ultrafine powder, polyphenylene ether (PPE) and polystyrene (PS) were molten and kneaded at 270° C. by means of a melt kneading equipment so that a volume ratio of insulated ultrafine powder/PPE/PS was 25/37.5/37.5, and the mixture was pelletized to obtain a resin composite material.

A dielectric constant thereof at 1 MHz was measured to find that a specific inductive capacity was 15 and that a dielectric loss tangent was 0.008. Further, a specific gravity of the resin composite material was 1.24.

Example 9

The components were molten and kneaded at 270° C. by means of a melt kneading equipment in the same manner as in Example 8, except that a volume ratio of insulated ultrafine powder/PPE/PS was 20/40/40, and the mixture was pelletized to obtain a resin composite material.

A dielectric constant thereof at 1 MHz was measured to find that a specific inductive capacity was 12 and that a dielectric loss tangent was 0.005. Further, a specific gravity of the resin composite material was 1.2.

Example 10

The components were molten and kneaded at 270° C. by means of a melt kneading equipment in the same manner as in Example 1, except that a volume ratio of insulated ultrafine powder/PPE/PS was 30/35/35, and the mixture was pelletized to obtain a resin composite material.

A dielectric constant thereof at 1 MHz was measured to find that a specific inductive capacity was 18 and that a dielectric loss tangent was 0.011. Further, a specific gravity of the resin composite material was 1.29.

Example 11

The components were molten and kneaded at 270° C. by means of a melt kneading equipment in the same manner as in Example 8, except that the particles synthesized in the synthesizing method 2 for insulated ultrafine powder were used, and the mixture was pelletized to obtain a resin composite material.

A dielectric constant thereof at 1 MHz was measured to find that a specific inductive capacity was 11 and that a dielectric loss tangent was 0.005. Further, a specific gravity of the resin composite material was 1.2.

Comparative Example 2

The components were molten and kneaded at 270° C. by means of a melt kneading equipment in the same manner as in Example 8, except that the particles synthesized in the synthesizing method 3 for insulated ultrafine powder were used, and the mixture was pelletized to obtain a resin composite material.

A dielectric constant thereof at 1 MHz was measured to find that a specific inductive capacity was 11 and that a dielectric loss tangent was 0.04. Further, a specific gravity of the resin composite material was 1.2.

Example 12

The components were molten and kneaded at 270° C. by means of a melt kneading equipment in the same manner as in Example 8, except that the particles synthesized in the synthesizing method 4 for insulated ultrafine powder were used, and the mixture was pelletized to obtain a resin composite material.

A dielectric constant thereof at 1 MHz was measured to find that a specific inductive capacity was 10 and that a dielectric loss tangent was 0.005. Further, a specific gravity of the resin composite material was 1.21.

Example 13

The insulated ultrafine powder obtained in the synthesizing method 1 for insulated ultrafine powder and polybutylene terephthalate (PBT) were molten and kneaded at 270° C. by means of a melt kneading equipment so that a volume ratio of insulated ultrafine powder/PBT was 25/75, and the mixture was pelletized to obtain a resin composite material.

A dielectric constant thereof at 1 MHz was measured to find that a specific inductive capacity was 16 and that a dielectric loss tangent was 0.01. Further, a specific gravity of the resin composite material was 1.45.

Example 14

The components were molten and kneaded at 270° C. by means of a melt kneading equipment in the same manner as in Example 13, except that a volume ratio of insulated ultrafine powder/PBT was changed to 20/80, and the mixture was pelletized to obtain a resin composite material.

A dielectric constant thereof at 1 MHz was measured to find that a specific inductive capacity was 13 and that a dielectric loss tangent was 0.008. Further, a specific gravity of the resin composite material was 1.29.

Example 15

The components were molten and kneaded at 270° C. by means of a melt kneading equipment in the same manner as in Example 13, except that a volume ratio of insulated ultrafine powder/PBT was changed to 30/70, and the mixture was pelletized to obtain a resin composite material.

A dielectric constant thereof at 1 MHz was measured to find that a specific inductive capacity was 20 and that a dielectric loss tangent was 0.015. Further, a specific gravity of the resin composite material was 1.53.

Example 16

The insulated ultrafine powder obtained in the synthesizing method 1 for insulated ultrafine powder and polypropylene (PP) were molten and kneaded at 220° C. by means of a melt kneading equipment so that a volume ratio of insulated ultrafine powder/PP was 25/75, and the mixture was pelletized to obtain a resin composite material.

A dielectric constant thereof at 1 MHz was measured to find that a specific inductive capacity was 12 and that a dielectric loss tangent was 0.008. Further, a specific gravity of the resin composite material was 1.07.

Example 17

The components were molten and kneaded at 220° C. by means of a melt kneading equipment in the same manner as in Example 16, except that a volume ratio of insulated ultrafine powder/PP was changed to 20/80, and the mixture was pelletized to obtain a resin composite material.

A dielectric constant thereof at 1 MHz was measured to find that a specific inductive capacity was 10 and that a dielectric loss tangent was 0.007. Further, a specific gravity of the resin composite material was 1.05.

Example 18

The components were molten and kneaded at 220° C. by means of a melt kneading equipment in the same manner as in Example 16, except that a volume ratio of insulated ultrafine powder/PP was changed to 30/70, and the mixture was pelletized to obtain a resin composite material.

A dielectric constant thereof at 1 MHz was measured to find that a specific inductive capacity was 14 and that a dielectric loss tangent was 0.009. Further, a specific gravity of the resin composite material was 1.12.

The invention claimed is:

1. An insulated ultrafine powder obtained by adding liquid metal alkoxide having alkyl groups other than methyl groups to a methanol-containing organic solvent in which a conductive ultrafine powder comprising a carbon material is dispersed, further adding an organic silicon compound or a coupling agent and then adding water thereto, said insulated ultrafine powder having an insulated coating film on a surface of the conductive ultrafine powder, wherein said liquid metal alkoxide is turned into a solid material by alcohol substitution reaction with methanol.

2. The insulated ultrafine powder according to claim 1, wherein a cross-sectional diameter of the conductive ultrafine powder comprising a carbon material is 1 nm or more and 500 nm or less.

3. The insulated ultrafine powder according to claim 1, wherein the carbon material constituting the conductive ultrafine powder is a carbon nanofiber, natural graphite, carbon black, a carbon nanotube or artificial graphite.

4. The insulated ultrafine powder according to claim 1, wherein a constitutional metal element of the liquid metal alkoxide contains at least any one kind of Ti and Zr.

5. The insulated ultrafine powder according to claim 1, wherein the coupling agent is a silane base coupling agent.

6. The insulated ultrafine powder according to claim 1, wherein a specific inductive capacity of 10 or more is obtained by blending the insulated ultrafine powder with resin in an amount of 50 vol % or less.

* * * * *